United States Patent
Dakshinamurthy et al.

(10) Patent No.: US 9,107,167 B2
(45) Date of Patent: Aug. 11, 2015

(54) ENVELOPE TRACKING SIGNAL BANDWIDTH CONTROL

(71) Applicant: Broadcom Corporation, Irvine, CA (US)

(72) Inventors: Sriraman Dakshinamurthy, San Jose, CA (US); Robert Gustav Lorenz, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 97 days.

(21) Appl. No.: 13/930,433

(22) Filed: Jun. 28, 2013

(65) Prior Publication Data

US 2014/0155002 A1    Jun. 5, 2014

Related U.S. Application Data

(60) Provisional application No. 61/783,620, filed on Mar. 14, 2013, provisional application No. 61/732,780, filed on Dec. 3, 2012.

(51) Int. Cl.
*H04B 1/38* (2015.01)
*H04W 52/02* (2009.01)
*H04B 1/04* (2006.01)
*H04B 1/16* (2006.01)

(52) U.S. Cl.
CPC .............. *H04W 52/028* (2013.01); *H04B 1/04* (2013.01); *H04B 1/0475* (2013.01); *H04B 1/1615* (2013.01); *H04B 2001/0441* (2013.01)

(58) Field of Classification Search
CPC .............................................. H04B 2001/0408
USPC ..................... 455/90.2, 230, 127.5
See application file for complete search history.

(56) References Cited

U.S. PATENT DOCUMENTS

| | | | |
|---|---|---|---|
| 6,157,253 A * | 12/2000 | Sigmon et al. ................ 330/10 |
| 6,674,856 B1 | 1/2004 | Hendricks et al. |
| 7,482,869 B2 | 1/2009 | Wilson |
| 7,764,060 B2 | 7/2010 | Wilson |
| 7,868,698 B2 | 1/2011 | Wilson |
| 8,093,945 B2 | 1/2012 | Wimpenny |
| 8,093,946 B2 | 1/2012 | Wimpenny et al. |
| 8,093,979 B2 | 1/2012 | Wilson |
| 8,106,713 B2 | 1/2012 | Wilson |
| 8,169,261 B2 | 5/2012 | Wilson |
| 8,294,522 B2 | 10/2012 | Flint et al. |
| 8,319,570 B2 | 11/2012 | Wilson |
| 2012/0270511 A1 | 10/2012 | Dakshinamurthy et al. |

OTHER PUBLICATIONS

Behravan, Ali, et al., Adaptive Predistorter Design for Nonlinear High Power Amplifiers, Chalmers University of Technology, Göteborg, Sweden, 2003, 4 pages.

(Continued)

*Primary Examiner* — Eugene Yun
(74) *Attorney, Agent, or Firm* — Brinks Gilson & Lione (57) ABSTRACT

An envelope tracking circuit for a transmit and receive path for a telecommunications device includes a filter to reduce the bandwidth of the transmit signal. The envelope of the filtered signal having the lower bandwidth is used to dynamically modulates the power amplifier voltage supply signal. The filter depends on current instantaneous values and also depends in a nonlinear way on instantaneous past and future values of the envelope tracking signal. The filter may be symmetric about peaks of the transmitted signal.

19 Claims, 6 Drawing Sheets

(56) References Cited

OTHER PUBLICATIONS

Dahlman, Erik, et al., Key features of the LTE radio interface, Ericsson Review No. 2, 2008, 4 pages.

LTM 9003, 12-Bit Digital Pre-Distortion µModule Receiver Subsystem, Linear Technology Corporation, Milpitas, California, downloaded May 2013, 24 pages.

Seydou, N., Efficient Digital Baseband Predistortion for Modern Wireless Handsets, Georgia Institute of Technology, Dec. 2009, 133 pages.

GC5322, Wideband Digital Pre-Distortion Transmit IC Solution, Texas Instruments Incorporated, 2008, 4 pages.

GC5325, Wideband Digital Predistortion Transmit Processor, Texas Instruments Incorporated, 2009, 24 pages.

GC5328, Low-Power Wideband Digital Predistortion Transmit Processor, Texas Instruments Incorporated, 2009, 27 pages.

Verfaillie, G., White paper Equalising and Predistortion: The Equalink™ concept, Newtec Cy N.V., 2008, 8 pages.

* cited by examiner

Figure 6

ENVELOPE TRACKING SIGNAL BANDWIDTH CONTROL

CROSS REFERENCE TO RELATED APPLICATIONS

This application claims priority to U.S. Provisional Application Ser. No. 61/783,620, filed Mar. 14, 2013, and to U.S. Provisional Application Ser. No. 61/732,780, filed Dec. 3, 2012, which are incorporated herein by reference in its entirety.

TECHNICAL FIELD

This disclosure relates generally to telecommunications. More particularly, this disclosure relates to control of signal bandwidth in an envelope tracking telecommunication system.

BACKGROUND

Rapid advances in electronics and communication technologies, driven by immense customer demand, have resulted in the widespread adoption of mobile communication devices. The extent of the proliferation of such devices is readily apparent in view of some estimates that put the number of wireless subscriber connections in use around the world at nearly 80% of the world's population. Furthermore, other estimates indicate that (as just three examples) the United States, Italy, and the UK have more mobile phones in use in each country than there are people living in those countries. Improvements in wireless communication devices, particularly in their ability to reduce power consumption, will help continue to make such devices attractive options for the consumer.

BRIEF DESCRIPTION OF THE DRAWINGS

The innovation may be better understood with reference to the following drawings and description. In the figures, like reference numerals designate corresponding parts throughout the different views.

DETAILED DESCRIPTION

An envelope tracking circuit in a radio transmitter generates a power amplifier voltage supply signal that tracks the envelope of the input signal to be amplified, plus some headroom, thereby achieving significant power savings in the power amplifier compared to driving the power amplifier with a fixed DC voltage. However, the variable power amplifier supply signal includes high frequency components that cause significant power dissipation in the power amplifier. This disclosure is related to reducing the bandwidth of the power supply signal provided to the power amplifier, without creating problematic artifacts or distortion in the supply signal, like a linear filter might, while maintaining a power supply voltage supply signal that accurately tracks the input signal. This provides a significant over other filters such as fast attack, slow decay filters.

The discussion below makes reference to user equipment. User equipment may take many different forms and have many different functions. As one example, user equipment may be a 2G, 3G, or 4G/LTE cellular phone capable of making and receiving wireless phone calls, and transmitting and receiving data. The user equipment may also be a smartphone that, in addition to making and receiving phone calls, runs any number or type of applications. User equipment may be virtually any device that wirelessly connects to a network, including as additional examples a driver assistance module in a vehicle, an emergency transponder, a pager, a satellite television receiver, a networked stereo receiver, a computer system, music player, or virtually any other device. The techniques discussed below may also be implemented in a base station or other network controller that communicates with the user equipment.

Figure 1:
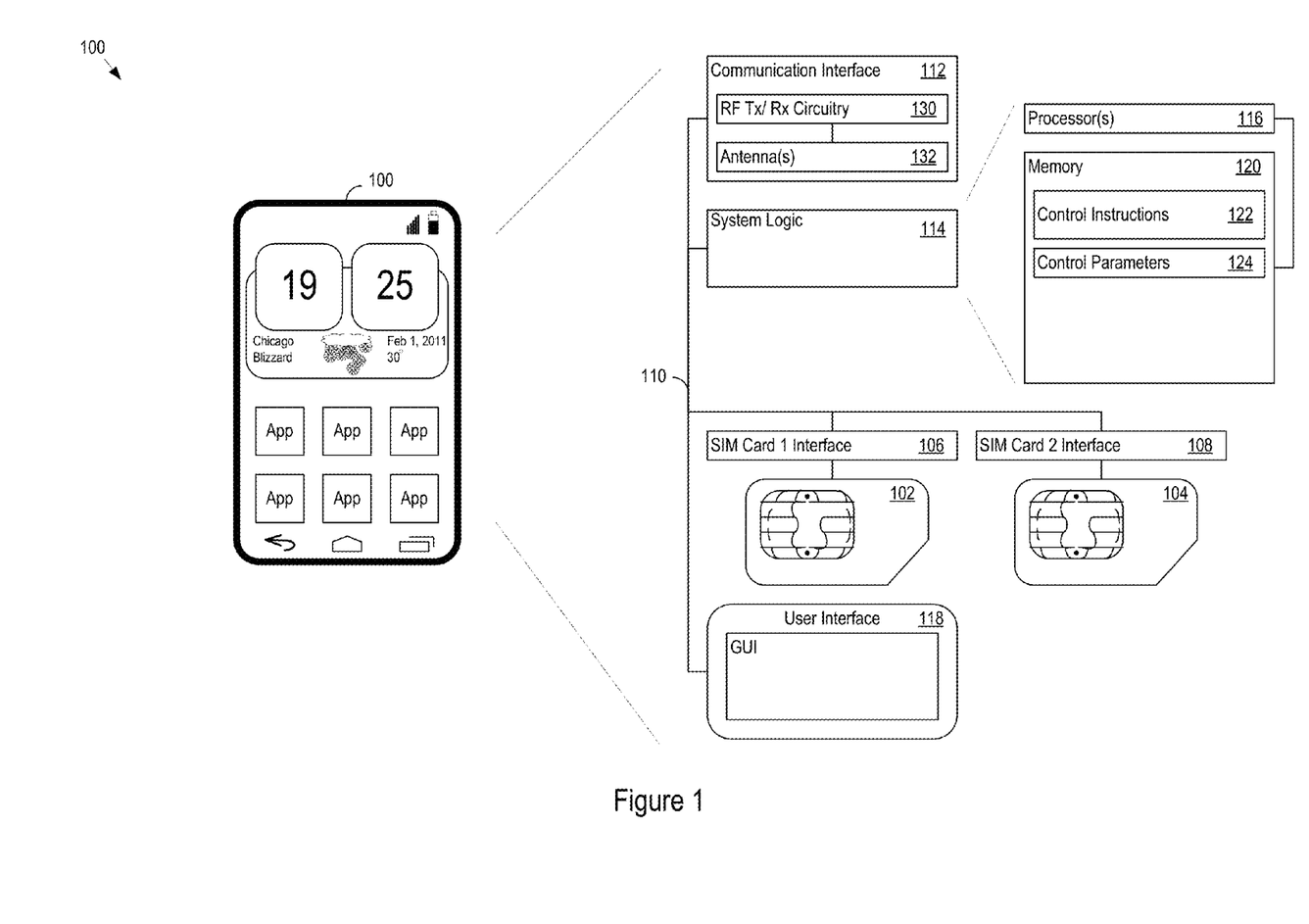
FIG. 1 shows an example of user equipment that includes a transmit chain and a receive chain.

FIG. 1 shows an example of user equipment (UE) 100. In this example, the UE 100 has multiple SIMs, namely the SIM1 102 and the SIM2 104. An electrical and physical interface 106 connects SIM1 102 to the rest of the user equipment hardware, for example, through the system bus 110. Similarly, the electrical and physical interface 108 connects the SIM2 to the system bus 110.

The user equipment 100 includes a communication interface 112, system logic 114, and a user interface 118. The system logic 114 may include any combination of hardware, software, firmware, or other logic. The system logic 114 may be implemented, for example, in a system on a chip (SoC), application specific integrated circuit (ASIC), or other circuitry. The system logic 114 is part of the implementation of any desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface, touch sensitive display, voice or facial recognition inputs, buttons, switches, speakers and other user interface elements.

In the communication interface 112, Radio Frequency (RF) transmit (Tx) and receive (Rx) circuitry 130 handles transmission and reception of signals through the antenna(s) 132. The communication interface 112 may include one or more transceivers. The transceivers may be wireless transceivers that include modulation/demodulation circuitry, digital to analog converters (DACs), analog to digital converters (ADCs), filters, waveform shapers, pre-amplifiers, power amplifiers and/or other logic for transmitting and receiving through one or more antennas, or through a physical (e.g., wireline) medium. As one implementation example, the communication interface 112 and system logic 114 may include a BCM2091 EDGE/HSPA Multi-Mode, Multi-Band Cellular Transceiver and a BCM59056 advanced power management unit (PMU), controlled by a BCM28150 HSPA+ system-on-a-chip (SoC) baseband smartphone processor or a BCM25331 Athena™ baseband processor. These devices or other similar system solutions may be extended as described below to provide the additional functionality described below. These integrated circuits, as well as other hardware and software implementation options for the user equipment 100, are available from Broadcom Corporation of Irvine Calif.

The transmitted and received signals may adhere to any of a diverse array of formats, protocols, modulations (e.g., QPSK, 16-QAM, 64-QAM, or 256-QAM), frequency channels, bit rates, and encodings. As one specific example, the communication interface 112 may support transmission and reception under the Universal Mobile Telecommunications System (UMTS). The techniques described below, however, are applicable to other communications technologies that include paging whether arising from the 3rd Generation Partnership Project (3GPP), GSM® Association, 4G/Long Term Evolution (LTE)™ efforts, High Speed Packet Access (HSPA)+, or other partnerships or standards bodies.

The system logic 114 may include one or more processors 116 and memories 120. The memory 120 stores, for example, control instructions 122 that the processor 116 executes to carry out any of the processing or control functionality described below, operating in communication with the logic in the communication interface 112. For example, the system logic 114 may reprogram, adapt, or modify parameters (e.g., a shaping table or filter coefficients) or operational characteristics of the logic in the communication interface 112. The memory 120 may also include control parameters 124 that the control instructions 122 read, write, or modify in carrying out the functionality.

Figure 2:
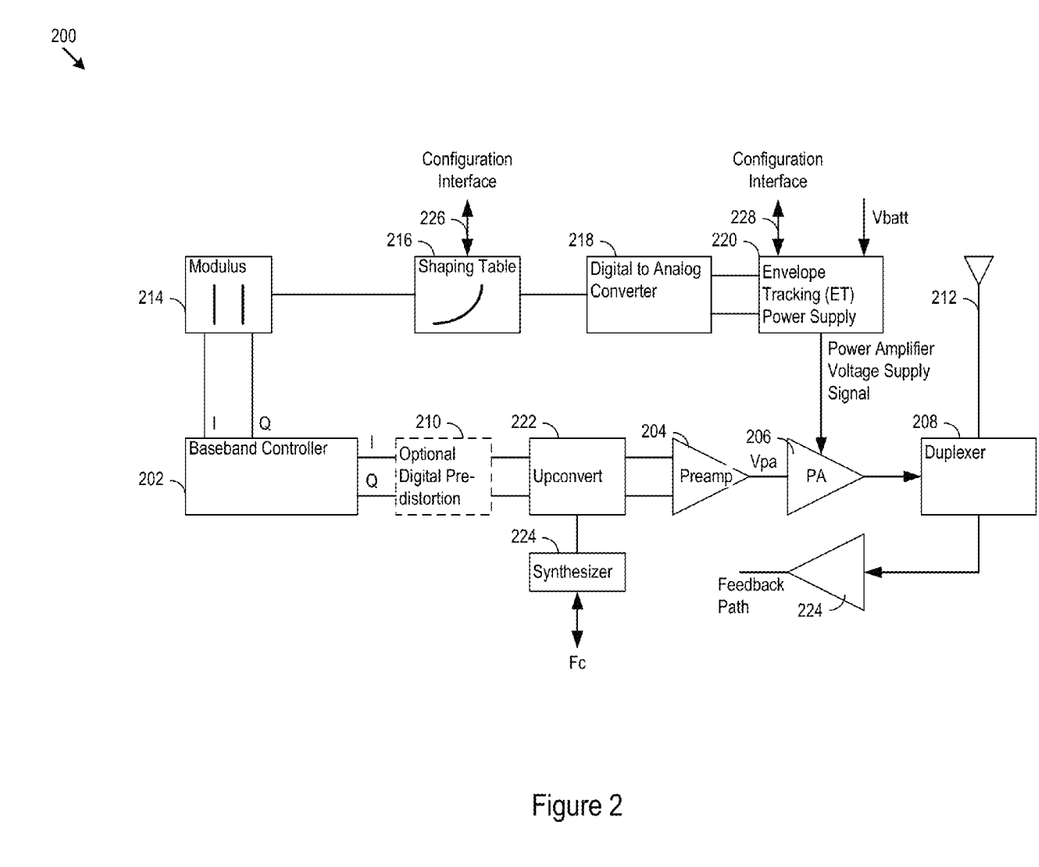
FIG. 2 is an example of a transmit and receive chain.

FIG. 2 shows an example of a transmit/receive chain 200 that may be present in the user equipment 100. As will be described in more detail below, the chain 200 may include parts of the Tx/Rx circuitry 130 and the system logic 114 described above in conjunction with FIG. 1. The chain 200 includes a baseband controller 202, a preamplifier 204, a power amplifier (PA) 206, and a duplexer 208. Pre-distortion logic 210 is optionally present, and may modify the input signal samples from the baseband controller 202 prior to generation of the preamplifier output signal to the PA 206. An upconversion section 222 prepares the input signal samples for transmission. The transmission may be centered at a particular center frequency Fc, as instructed by a base station (for example) and as provided by the frequency synthesizer 224. The upconversion section may shift the frequency band of the I and Q signals from the baseband controller to, for example, approximately 700 MHz or 1900 MHz. The upconversion section 222 may implement a processing flow for the input signal samples that includes, as examples, a pre-emphasis or baseband gain stage, I and Q DACs, analog filters, and mixers for upconversion to Fc, prior to the pre-amplification stage 204.

The duplexer 208 may implement a transmit/receive switch under control of the system logic 114. In one switch position, the duplexer 208 passes amplified transmit signals through the antenna 212. In a different switch position, the duplexer 208 passes received signals from the antenna 212 to the feedback path 224.

The baseband controller 202 may be part of the system logic 114 (FIG. 1) and provides, e.g., in phase and quadrature (I/Q) input signal samples to the modulus logic 214. The may output the absolute value (e.g., the square root of I squared plus q squared) of the input signal to a shaping table 216. The shaping table 216 maps input values to output values in a linear or non-linear manner. The output of the shaping table 216 feeds the digital to analog converter (DAC) 218. In turn, the DAC 218 outputs the envelope of the input signal as modified by the shaping table to the envelope tracking (ET) power supply 220. Configuration interfaces 226 and 228, e.g., serial or parallel data interfaces, control pins, or other interfaces, may be provided to configure the shaping table 216 and ET 220, or other parts of the user equipment 100. The configuration interfaces 226 and 228 may be MIPI Alliance specified interfaces.

FIG. 1 shows an example of user equipment (UE) 100. In this example, the UE 100 has multiple SIMs, namely the SIM1 102 and the SIM2 104. An electrical and physical interface 106 connects SIM1 102 to the rest of the user equipment hardware, for example, through the system bus 110. Similarly, the electrical and physical interface 108 connects the SIM2 to the system bus 110.

The user equipment 100 includes a communication interface 112, system logic 114, and a user interface 118. The system logic 114 may include any combination of hardware, software, firmware, or other logic. The system logic 114 may be implemented, for example, in a system on a chip (SoC), application specific integrated circuit (ASIC), or other circuitry. The system logic 114 is part of the implementation of any desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface, touch sensitive display, voice or facial recognition inputs, buttons, switches, speakers and other user interface elements.

In the communication interface 112, Radio Frequency (RF) transmit (Tx) and receive (Rx) circuitry 130 handles transmission and reception of signals through the antenna(s) 132. The communication interface 112 may include one or more transceivers. The transceivers may be wireless transceivers that include modulation/demodulation circuitry, digital to analog converters (DACs), analog to digital converters (ADCs), filters, waveform shapers, pre-amplifiers, power amplifiers and/or other logic for transmitting and receiving through one or more antennas, or through a physical (e.g., wireline) medium. As one implementation example, the communication interface 112 and system logic 114 may include a BCM2091 EDGE/HSPA Multi-Mode, Multi-Band Cellular Transceiver and a BCM59056 advanced power management unit (PMU), controlled by a BCM28150 HSPA+ system-on-a-chip (SoC) baseband smartphone processer or a BCM25331 Athena™ baseband processor. These devices or other similar system solutions may be extended as described below to provide the additional functionality described below. These integrated circuits, as well as other hardware and software implementation options for the user equipment 100, are available from Broadcom Corporation of Irvine Calif.

The transmitted and received signals may adhere to any of a diverse array of formats, protocols, modulations (e.g., QPSK, 16-QAM, 64-QAM, or 256-QAM), frequency channels, bit rates, and encodings. As one specific example, the communication interface 112 may support transmission and reception under the Universal Mobile Telecommunications System (UMTS). The techniques described below, however, are applicable to other communications technologies that include paging whether arising from the 3rd Generation Partnership Project (3GPP), GSM® Association, 4G/Long Term Evolution (LTE)™ efforts, High Speed Packet Access (HSPA)+, or other partnerships or standards bodies.

The system logic 114 may include one or more processors 116 and memories 120. The memory 120 stores, for example, control instructions 122 that the processor 116 executes to carry out any of the processing or control functionality described below, operating in communication with the logic in the communication interface 112. For example, the system logic 114 may reprogram, adapt, or modify parameters (e.g., a shaping table or filter coefficients) or operational characteristics of the logic in the communication interface 112. The memory 120 may also include control parameters 124 that the control instructions 122 read, write, or modify in carrying out the functionality.

FIG. 2 shows an example of a transmit/receive chain 200 that may be present in the user equipment 100. As will be described in more detail below, the chain 200 may include parts of the Tx/Rx circuitry 130 and the system logic 114. The chain 200 includes a baseband controller 202, a preamplifier 204, a power amplifier (PA) 206, and a duplexer 208. Predistortion logic 210 is optionally present, and may modify the input signal samples from the baseband controller prior to generation of the preamplifier output signal to the PA 206. An upconversion section 222 prepares the input signal samples for transmission. The transmission may be centered at a particular center frequency Fc, as instructed by a base station (for example) and as provided by the frequency synthesizer 224. The upconversion section 222 may implement a processing flow for the input signal samples that includes, as examples, a pre-emphasis or baseband gain stage, I and Q DACs, analog filters, and mixers for upconversion to Fc, prior to the pre-amplification stage 204.

The power amplifier 206 amplifies an input signal having a frequency range of approximately 700 MHz or 1900 MHz, for example, depending on the bandwidth of interest, and a power of approximately 0 dBm or 1 mW. The output signal from the power amplifier 206 has approximately the same signal and output power of 27 dBm or 500 mW. The power amplifier 206 amplifies the signal while preserving its linearity into a 50 ohm load represented by the antenna 212.

The duplexer 208 may implement a transmit/receive switch under control of the system logic 114. In one switch position, the duplexer 208 passes amplified transmit signals through the antenna 212. In a different switch position, the duplexer 208 passes received signals from the antenna 212 to the feedback path 224. The feedback path 224 may be used to measure characteristics of the output signal provided to the antenna 212 by the PA 206 by a feedback receiver.

Components at the output of the power amplifier 206 may impose a load on the power amplifier 206. The load may represent as much as 3-4 dB of insertion loss where a duplexer is used. If no duplexer is used, as in a time division duplex radio, the insertion loss may be less.

The baseband controller 202 may be part of the system logic 114 and provides, e.g., in phase/quadrature (I/Q) input signal samples to the modulus logic 214. The modulus logic 214 may output the absolute value (e.g., the square root of I squared plus q squared) of the input signal to a shaping table 216. The shaping table 216 maps input values to output values in a linear or non-linear manner. The output of the shaping table 216 feeds the digital to analog converter (DAC) 218. In turn, the DAC 218 outputs the envelope of the input signal as modified by the shaping table to the envelope tracking (ET) power supply 220. Configuration interfaces 226 and 228, e.g., serial or parallel data interfaces, control pins, or other interfaces, may be provided to configure the shaping table 216 and ET 220, or other parts of the user equipment 100. The configuration interfaces 226 and 228 may be MIPI Alliance specified interfaces.

The envelope tracking power supply (ET) 220 receives the envelope signal from the DAC 218. The ET 220 may output a PA power supply voltage signal that follows the envelope signal, plus a preconfigured amount of headroom. The PA power supply voltage signal is provided to the PA 206.

In other configurations or under other circumstances, the ET 220 may output a different supply signal, such as a direct current (DC) supply signal that may be equal, e.g., to the battery voltage Vbatt, or another DC level. The PA power supply voltage signal provides power to the PA 206 for driving the antenna 212 with the transmit signal.

In normal operation, a fixed 3.7 volt voltage supply is presented to the PA 206. The output signal from the PA 206 can vary from 0 V to the full 3.7 volts. The envelope of the output RF signal varies in proportion to the desired transmit signal, such as 20 MHz for a 4G/LTE transmitter. The output signal itself is at 1900 MHz but a significant portion of the envelope will be within the 20 MHz envelope.

An envelope tracking power supply (ET) 220 receives the envelope signal from the DAC 218. The ET 220 may output a PA power supply voltage signal that follows the envelope signal, plus a preconfigured amount of headroom. In other configurations or under other circumstances, the ET 220 may output a different supply signal, such as a direct current (DC) supply signal that may be equal, e.g., to the battery voltage Vbatt, or another DC level. The PA power supply voltage signal provides power to the PA 206 for driving the antenna 212 with the transmit signal.

During typical operation, most of the signal at the PA 206 will be much less than the peak value. To reduce power supply, the envelope tracker dynamically modulates the power amplifier voltage supply signal according to the envelope of the desired transmit signal. The goal of the ET 220 is to continually minimize the headroom between the presently available signal at the output of the PA 206 and the power supply signal applied by the ET 220. This has a benefit of reducing power dissipation in the circuit 200.

The ET 220 has its own overhead of power dissipation. When operating in the top 6-8 dB of the power amplifier 206 operation region, from approximately 20 dBm to 27 dBm, with approximately 3-4 dBm of insertion loss between the PA 206 and the antenna, the antenna will have a power level of 17-23 dBm. Accordingly, it will be seen that it may be better to use the ET 220 and power amplifier 206 at those relatively high power levels. However, when dropping below approximately 17 dBm at the antenna, the benefits of dynamically modulating the power supply provided to the PA 206 are reduced. That mode may be referred to as average power tracking. Instead of 3.7 volts modulated, a steady state voltage such as 1.0 volt may be applied to the PA 206.

The PA 206 is suitably linear with a supply voltage of 3.6 V. The supply voltage may be reduced to approximately 0.8 or 1.0V and the PA 206 will remain suitably linear in operation. However, below about 0.8 V, devices will no longer operate in linear mode. Therefore, the power supply to the PA 206 cannot be modulated below about 0.8 V. Therefore, a shaping technique is applied to relate the I and Q signals and the ET 220. The shaping table 216 performs the necessary mapping. The shaping table 216 may be formed based on laboratory measurements, simulation or otherwise. This may be implemented as a lookup table with a relatively small number of values, such as 64 values.

The ET 220 converts a live reference signal from the DAC 218 having a frequency bandwidth of approximately 20 MHz and produces a highly accurate, high bandwidth power supply signal for the PA 206. The ET 220 can dynamically vary output voltage from approximately 1 V to approximately 3.7 V at 20 MHz. The ET 220 operates as a switching power supply at 20 MHz, a very high bandwidth for such a circuit.

It is desirable to reduce the required bandwidth of 20 MHz for the ET 220 to a lower bandwidth value. Operation of the ET 220 at a lower bandwidth will allow more efficient operation. The ET 220 must maintain adequate headroom for the PA 206 to operate linearly, but without dissipating added power as heat. These requirements are explained further below.

There are two main motivation factors for lowering the bandwidth of an envelope tracking (ET) signal provided to a power amplifier. First, a PA while operated under ET, operates partially as a mixer circuit. The output spectrum of an ET operated PA resembles a convolution of the desired spectrum together with the spectrum of the ET signal. Since the ET signal represents the absolute value of the transmit signal, it has a large bandwidth. The high frequency components of the ET signal, due to the convolution, carry some of the transmit power to the receive band, and create an elevated noise floor in the receive band.

The second motivation is to support a class of ET devices which may be incorporated in transmitter circuits but which are limited by bandwidth of operation. Envelope tracking power supplies achieve a high bandwidth DC-to-DC conversion, using a combination of a switched power supply and an optional linear error amplifier. The switched power supply delivers power efficiently, while the error amplifier is used in a feedback loop to ensure linearity. Some designs of envelope tracking power supplies do not use an error amplifier, and rely on a highly accurate switched power supply that operates at 5 to 10 times the bandwidth of interest. The envelope tracking power supplies available in the market can be classified into two groups, as follows.

The first class of envelope tracking switching power supplies uses a low frequency switching stage using hysteric controller, together with an error amplifier to ensure linear operation. These envelope tracking switching power supplies are capable to scale to LTE 20 MHz operation, since the switching frequencies are low. However, the error amplifier needs to be designed to meet receive band noise requirements and hence must dissipate a significant amount of power. Samples available currently −124 dBm/Hz in receive band noise performance. These error amplifiers are also designed to drive a very low capacitive load, such as 1 to 2 nF. These envelope tracking switching power supplies also require a specially designed power amplifier that works under ET operation, and do not work well when directly connected to a battery. This class of envelope tracking switching power supplies requires close coordination between the envelope tracking circuit designers and the power amplifier designers.

The baseband controller 202 has knowledge of the characteristics of the input I and Q signal to the modulus logic 214. This knowledge of the input signal can be used in a look ahead fashion to ramp up the ET 220 to respond to the input signal. However, letting the PA voltage supply signal merely decay after a peak when a high voltage is no longer needed may introduce unwanted power dissipation. Also, asymmetry in the waveform due to decay will cause adjacent channel leakage or out of band emissions from the power amplifier 206.

Accordingly, a symmetrical perturbation about the desired envelope tracking voltage provided to the PA 206 is desired. In one embodiment, then, a minimally required voltage is supplied along with a small voltage perturbation such that the two combine as a smooth function that nominally is symmetric about the peaks of the input I and Q signal. The ET power supply signal should be centered in time on the peaks of the input I and Q signal and should generally not lead or lag the peaks of the signal.

Figure 3:
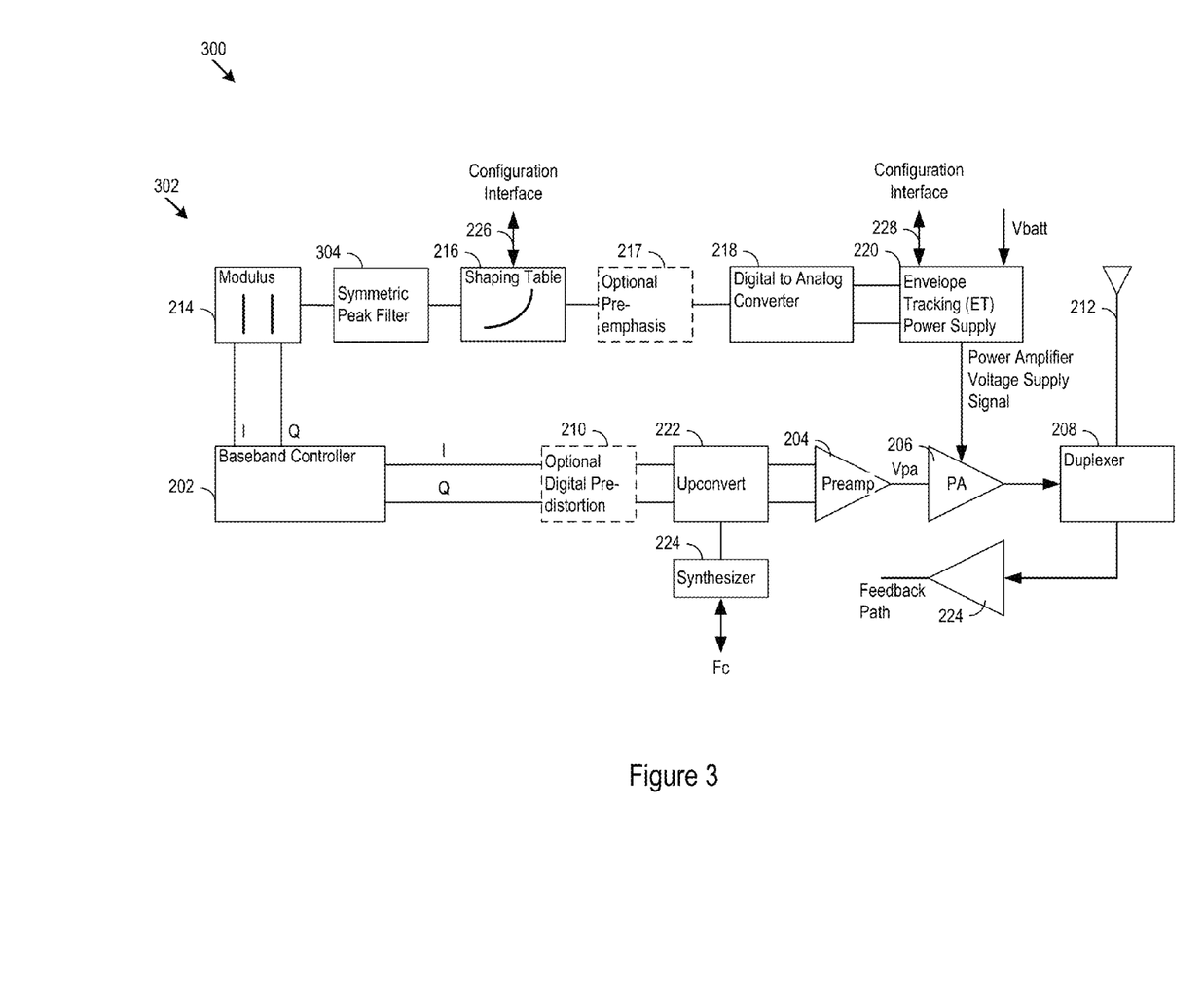
FIG. 3 is an example of a second transmit and receive chain.

FIG. 3 is an example of a second transmit and receive chain 300 that may be used in user equipment such as a 2G, 3G, or 4G/LTE cellular phone or other device. The transmit and receive path 300 generally may be configured and operate like the transmit/receive chain 200 described above in conjunction with FIG. 2. To that end, the transmit and receive chain includes a base band controller 202, a preamplifier 204, a power amplifier (PA) 206, a duplexer 208 and an optional digital predistortion function 210. The transmit and receive path 300 communicates radio signals through an antenna 212. These components may be generally configured and operated as described above in conjunction with FIG. 2.

The transmit and receive path 300 further includes an envelope tracking circuit 302. The envelope tracking circuit 302 includes a symmetric peak filter 304, a shaping table 216, a digital to analog converter (DAC) 218 and an envelope tracking power supply (ET) 220. Optionally, a pre-emphasis filter 306 may be included between the shaping table 216 and the DAC 218.

The structure and function of the shaping table 216, the DAC 218 and the ET 220 may be generally as described above in conjunction with FIG. 2. The envelope tracking circuit 302 operates to provide a dynamic power amplifier voltage supply signal to the PA 206. The magnitude of the dynamic power amplifier voltage supply signal tracks the envelope of the transmit signal (I and Q) generated by the baseband controller.

The transmit signal (I and Q) generated by the baseband controller may have a bandwidth of 20 MHz. The ET 220 includes a switching power supply and 20 MHz is a relatively high bandwidth, especially for a device that must operate efficiently, with low power dissipation to provide a substantial current and made cost effectively.

Accordingly, the symmetric peak filter 304 is added to the envelope tracking circuit 302 to reduce the bandwidth of the transmit signal. In one example, the bandwidth of a 20 MHz transmit signal is reduced to approximately 5 MHz as an input to the DAC 218.

In the embodiment of FIG. 3, the symmetric peak filter 304 is positioned before the shaping table 216 so that the symmetric peak filter 304 filters the absolute value of the input signal or transmit signal. The filtered signal is provided to the shaping table 216. In other embodiments, the relative positions of the filter 304 and the shaping table 216 may be exchanged so that the filter 304 instead filters the output of the shaping table 216. Also, other components and functions may be included in the envelope tracking circuit 302 and all such changes may be made to optimize or improve one performance aspect or another of the transmit and receive chain 300. In some embodiments, the envelope tracking power supply 220 may introduce frequency selective effects. The frequency response of the envelope tracking power supply 220 may not be uniform across the range of frequencies of interest for the device. Accordingly, in some embodiments, to compensate for any frequency selective effects of the envelope tracking power supply 220, the pre-emphasis filter 217 may be included to pre-emphasize the signal applied to the ET power supply 220 with a filter function that is tailored to compensate for the frequency selective effects introduced by generating the voltage supply signal having a voltage magnitude that tracks the envelope of the filtered envelope signal. For example, the pre-emphasis filter 306 may have a frequency response that is substantially the inverse of the frequency response of the ET power supply 220 over the range of frequencies of interest. As a result of this compensation, substantially all filtering that happens in the envelope tracking function is governed by the peak symmetric filter 304.

Figure 4:
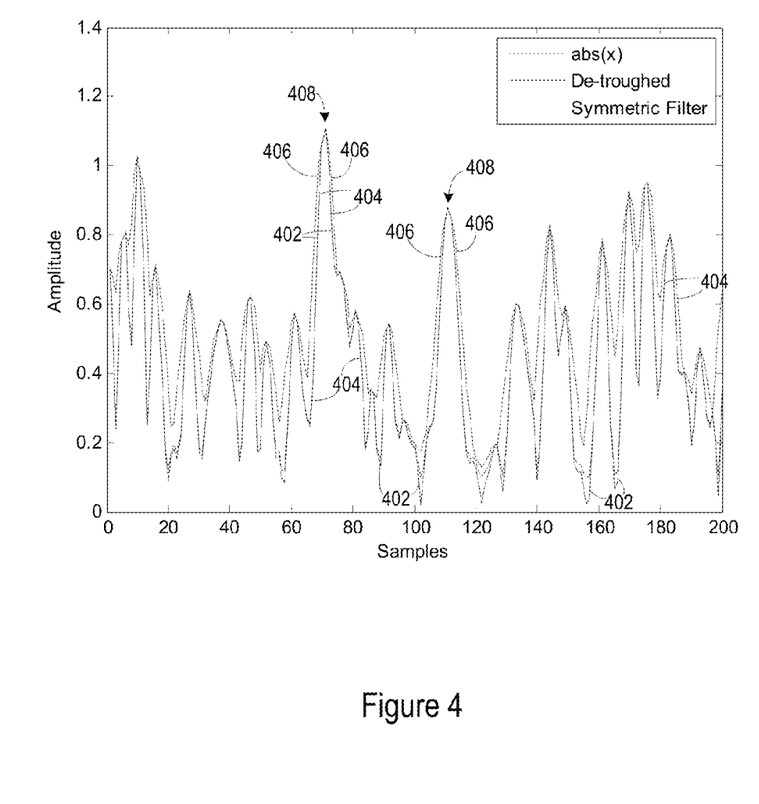
FIG. 4 is an example illustration of signals in the transmit and receive chain of FIG. 3.

FIG. 4 is an example illustration of signals in the transmit and receive chain 300 of FIG. 3. FIG. 4 shows a time domain plot of simulated performance of a peak symmetric filter 304 as used in the transmit and receive chain 300. FIG. 4 shows time on the horizontal axis, sampled at 100 M samples per second. The vertical axis of FIG. 4 shows normalized signal amplitude.

FIG. 4 shows three signals. A first signal is an input signal 402, labeled abs(x), and represents the output of the modulus logic 214, or absolute value (e.g., the square root of I squared plus q squared) of the input transmit signal. The second signal is a de-troughed signal 404. The fourth signal is the output signal 406 labeled symmetric filter.

The de-troughed signal 404 is the output of the shaping table produced in response to the input signal 402. The de-troughing signal 404 is shaped to restrict the minimal voltage at the input to the peak symmetric filter. This may be done, for example, by varying the gain applied to the input signal. The de-troughed signal 404 prevents the envelope tracking switching power supply from following the negative peaks of the input signal 402 too close to a zero value. Removing the troughs of the input signal to the filter has been found to improve efficiency of the overall circuit and to reduce spectral emissions. In one embodiment, the de-troughing function can be written as $$v_{out} = ((v_{min})^P + K|v_{in}|^P)^{1/P} + v_{offset}$$

In this example, $V_{out}$ is the output voltage from the de-troughing function, Vmin is an empirically determined minimum threshold such as 0.3 volts, Vin is the input voltage, K and P are empirical constants and $V_{offset}$ is a desired offset voltage. Other de-troughing functions may be substituted or other operations may be performed on the signal in the envelope tracking circuit to obtain necessary or desired effects.

The input signal 402 and the filter output signal 406 are particularly illustrated in conjunction with a peak 408 of the input signal 402. The performance of the peak symmetric filter 304 is clearly shown. The filter output signal 406 closely follows the input signal 402 at peaks of the filter input signal including the peak 408. Also, the filter output signal 406 is substantially symmetric about the peaks including peak 408 of the input signal 402. As illustrated in FIG. 4, the rising edge of the filter output signal 406 at the peak 408 leads the rising edge of the filter input signal by substantially the same amount as the falling edge of the filter output signal 406 lags the falling edge of the filter input signal at the same peak 408. The symmetry is maintained for all positive peaks of the filter input signal 402.

The signal produced by the symmetric filter has certain benefits. For example, the filter output signal 406 is a relatively smooth signal without a lot of high frequency components. Hence, it is easily passed by an envelope tracking switching power supply that has limited bandwidth. Second, if there is a large capacitive load at the output of the power amplifier driven by the envelope tracking circuit including the peak symmetric filter, a rapidly falling signal at the output of the PA will quickly discharge the capacitive load. However, this capacitance will subsequently have to be re-charged to an operating level. By slowing down the signal response of the PA using the smoothing peak symmetric filter, the amount of power discharged from the capacitive load is reduced and power consumption of the circuit to re-charge that capacitive load is reduced.

A symmetric function of the sort illustrated in FIG. 4 has been found to produce the best emission performance from the power amplifier being driven by the envelope tracking circuit 302. If an asymmetric function is applied, out of band emissions may exceed desired or permitted levels.

Also, the filter output signal 406 maintains a substantially consistent headroom or positive voltage differential over the filter input signal 402 at the peaks of the filter input signal 402. The headroom should be above a minimally required value which may be determined empirically or by simulation. By maintaining consistent headroom above a minimally required value, out of band emissions are reduced or minimized. It is desired to minimize power consumption but with the constraint that if the minimal headroom required is not maintained, the spectral mass increases in a disproportionate fashion. Thus, there is a tradeoff between the headroom maintained and performance in terms of power consumption and spectral mass.

In some embodiments, it may be preferred to use a non-causal filter. A non-causal filter uses future values of the filtered signal to produce an output signal. Values of the transmit signal may be stored in memory so that both past values, current or instantaneous values or future values of the transmit signal are available. In one example, after generating an envelope signal, the envelope signal is filtered in a filter which depends non-linearly on future values of the envelope signal. In another embodiment, the envelope signal is filtered in a filter so that the instantaneous value of the envelope amplitude is a function of both amplitude of the current transmit signal value as well as the amplitude of a stored future value of the transmit signal.

Figure 5:
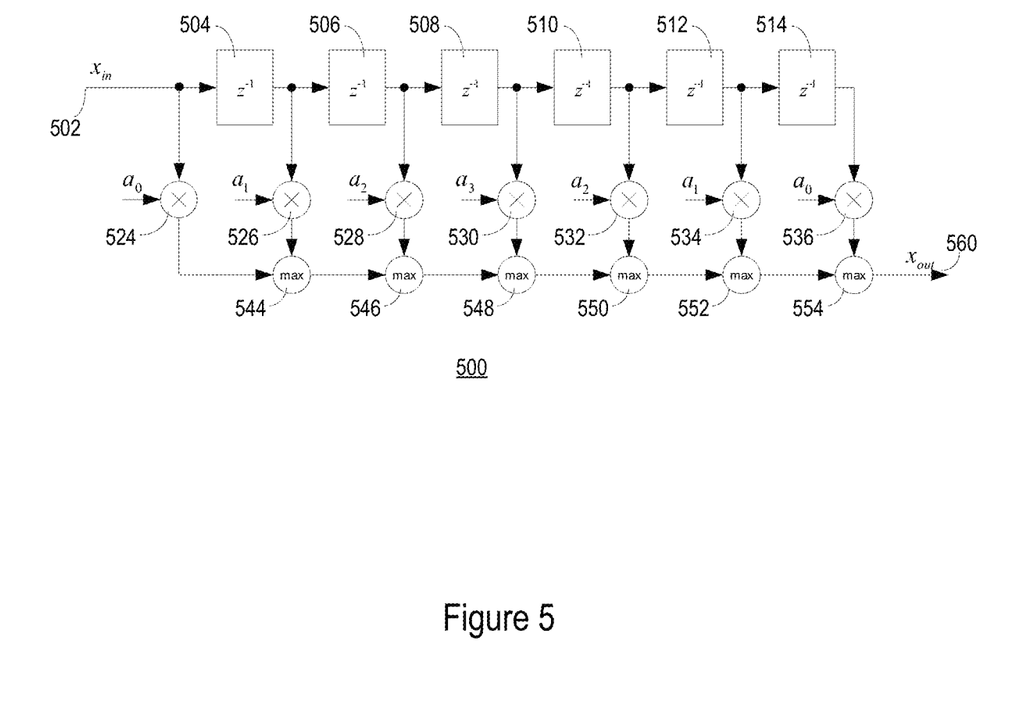
FIGS. 5 and 6 are examples of a peak symmetric filter.

FIG. 5 is a first example of a peak symmetric filter 500. The filter 500 is constructed similarly to a finite infinite response (FIR) filter but by replacing an adder block in a conventional FIR structure with a maximum finder. The filter includes an input 502 to receive an input signal $x_{in}$, a plurality of delay blocks 504, 506, 408, 510, 512, 514, a plurality of taps 524, 526, 528, 430, 532, 534, 536 and a plurality of maximum finder blocks 544, 546, 548, 550, 552, 554. The taps 524, 526, 528, 430, 532, 534, 536 have a first input coupled to the output of a delay block of the plurality of delay blocks 504, 506, 408, 510, 512, 514, and a second input configured to receive a filter coefficient $a_n$ where n=0 to 6. In the illustrated embodiment, because the filter is symmetric, $a_6=a_0$, $a_5=a_1$ and $a_4=a_3$. The output of each tap of the taps 524, 526, 528, 430, 532, 534, 536 is provided to an input of a respective maximum finder block of the plurality of maximum finder blocks 544, 546, 548, 550, 552, 554. Each respective maximum finder block evaluates the maximum value at each of its two inputs and passes that value to its output. The maximum finder blocks 544, 546, 548, 550, 552, 554 are chained together with the maximum finder block producing the output signal $x_{out}$ at an output 560.

The above filter implements the following relationship in order to create a low pass version of the envelope signal:

$$x_{out,k} = \max_{j=0}^{N} [a_j \cdot x_{k+j}]$$

In operation, filter coefficients $a_0$, $a_1$, $a_2$, $a_3$, and $a_4$, $a_5$, $a_6$, if used, are provided to the peak symmetric filter by a control circuit or from storage in a memory. Any suitable filter coefficients may be chosen to perform the desired filtering. In one embodiment, the filter coefficients are chosen to reduce the bandwidth of the input signal $x_{in}$ by a predetermined amount, such as from 20 MHz to approximately 5 MHz, for the output signal $x_{out}$. In another configuration, the filter coefficients may be chosen differently for past instantaneous values of the input signal and for future instantaneous values of the input signal. To produce a symmetric filter, the filter coefficients may be chosen so that the coefficients for past instantaneous values of the input signal match coefficients for future instantaneous values of the input signal.

Further, the filter coefficients may be chosen to produce a filter characteristic suitable to produce the features of the output signal and input signal illustrated in FIG. 4. For example, the filter coefficients may be chose so that the output signal symmetrically matches the peaks of the input signal and maintains a predetermined amount of headroom or positive voltage differential over the peak values of the input signal.

In another example, the filter 500 is a nonlinear filter that depends on an instantaneously desired value and also depends, in a non-linear way, on instantaneous future values and instantaneous past values. The coefficients $a_0$, $a_1$, $a_2$, $a_3$, $a_4$ establish the relationships between current, past and future instantaneous values. In one particular embodiment, the dependence on the past values and on future values is symmetric about the instantaneous value. The filter 500 incorporate non-linearities.

Figure 6:
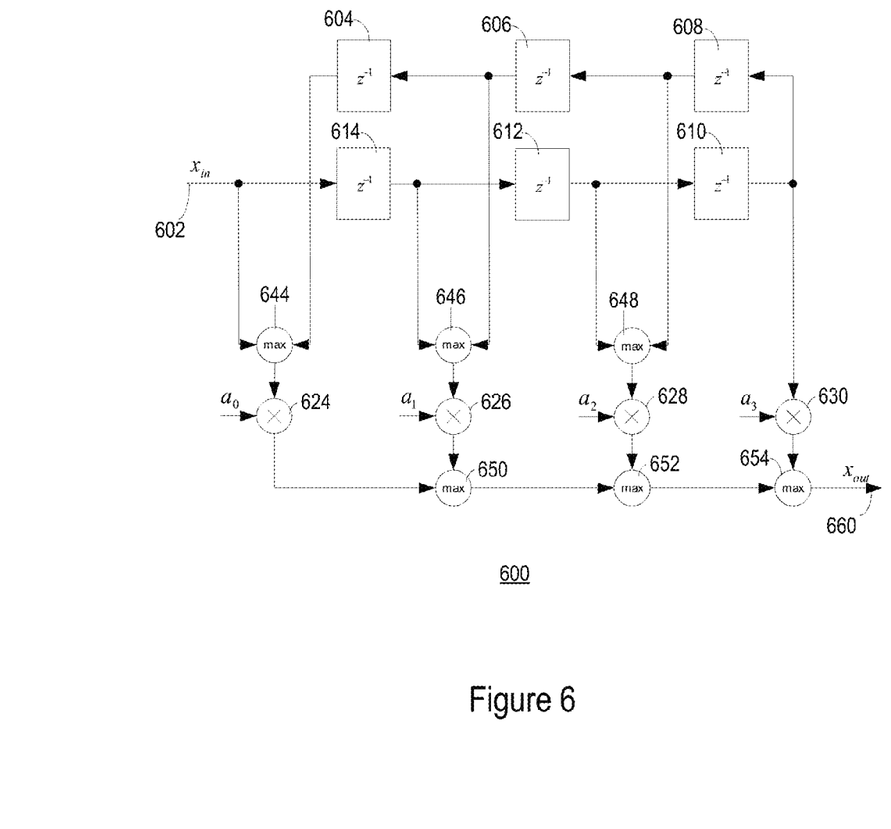

FIG. 6 is a second example of a peak symmetric filter 600. The filter 600 includes input 506 to receive an input signal $x_{in}$, a plurality of delay blocks 604, 606, 608, 610, 612, 614, a plurality of taps 624, 626, 628 and 630, and a plurality of maximum finder blocks 644, 646, 648, 650, 652, 654. The filter 600 is particularly well suited for implementing a symmetric filter. In the design of a symmetric filter, it is useful and efficient to have a mirror symmetry of the filter coefficients, such that $\alpha_k = \alpha_{N-k}$. The structure of the hardware can be modified to exploit this relationship by designing the filter as shown in FIG. 6. Thus, the filter taps 624, 626, 628 and 630 in the filter 600 receive coefficients $a_0$, $a_1$, $a_2$, $a_3$ which are applied to taps at the outputs of a first level of maximum finder block. After scaling by the filter coefficients $a_0$, $a_1$, $a_2$, $a_3$, a second level of maximum finder block is applied to produce the output signal $x_{out}$ at an output 660. The delay blocks 604, 606, 608, 610, 612, 614 loop back so that the output of the last delay block 604 in the chain is combined with current input $x_{in}$.

In operation, the filter 600 operates to implement a nonlinear function of instantaneous envelope tracking values having a dependence on past values and future values. The filter 600 produces a symmetric response about the current instantaneous value. The nonlinear function is symmetric about the peaks of the nominal envelope tracking signal. The filter 600 may be used in conjunction with the transmit and receive chain 300 of FIG. 3 to implement an improved envelope tracking power supply function in user equipment or other telecommunication device.

From the foregoing, it can be see that the present disclosure provides an improved envelope tracking circuit and method for a radio transmitter. The disclosed circuit and method provide substantial advantages over currently-available technologies. The intensely focused development of transceiver technologies for wireless communications systems has left relatively few remaining areas where improvements can be made that yield significant competitive and performance advantages. Aggressive power reduction is one such area, and even incremental advances in power savings can in combination produce significant overall advantages. This innovation disclosed herein achieves significant power reduction by reducing the bandwidth of the envelope tracking signal, without unduly compromising performance.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A system comprising:
an envelope circuit configured to receive a transmit signal and produce an envelope signal representative of an envelope of the transmit signal;
a power amplifier configured to amplify the transmit signal;
a filter configured to receive the envelope signal and produce a filtered envelope signal, the filter implementing a nonlinear filter function that depends on a current instantaneous value of the envelope signal and depends nonlinearly on past instantaneous values of the envelope signal and future instantaneous values of the envelope signal; and
an envelope tracking circuit coupled to the filter and responsive to the filtered envelope signal and coupled to the power amplifier to provide a power supply signal to power the power amplifier, the envelope tracking circuit producing the power supply signal according to the envelope of the filtered envelope signal.

2. The system of claim 1 wherein the filter implements a filter function that depends symmetrically on the past instantaneous values of the envelope signal and the future instantaneous values of the envelope signal.

3. The system of claim 2 wherein the filter is operative to receive a set of filter coefficients and wherein filter coefficients for the past instantaneous values of the envelope signal match filter coefficients for the future instantaneous values of the envelope signal.

4. The system of claim 1 wherein the filter produces the filtered envelope signal having a substantially lower bandwidth than bandwidth of the envelope signal.

5. The system of claim 1 wherein the filter combines respective filter coefficients with respective past instantaneous values of the envelope signal and respective future instantaneous values of the envelope signal and evaluates a maximum value for each instantaneous value of the envelope signal.

6. The system of claim 1 further comprising:
a shaping table coupled between the filter and the envelope tracking circuit to map input values of the filtered envelope signal from the filter to output values; and
a digital to analog converter coupled between the shaping table and the envelope tracking circuit to convert the output value from the shaping table to an input signal for the envelope tracking circuit.

7. A method comprising:
at a communication device, receiving a transmit signal for radio transmission;
producing an envelope signal of the envelope of the transmit signal;
amplifying the transmit signal in a power amplifier;
filtering the transmit signal in a non-linear filter that depends on a current instantaneous value and depends on a non-linear way on a future instantaneous value and a past instantaneous value to reduce bandwidth of the envelope signal and produce a filtered transmit signal; and
applying to the power amplifier a voltage supply signal having a voltage magnitude that tracks the envelope of the filtered transmit signal.

8. The method of claim 7 wherein filtering the transmit signal comprises reducing the bandwidth of the transmit signal from about 20 MHz to about 5 MHz.

9. The method of claim 7 wherein filtering the transmit signal comprises filtering the transmit signal in a symmetric peak filter.

10. The method of claim 7 wherein filtering the transmit signal comprises filtering the transmit signal in a non-linear filter that depends on a future instantaneous value and a past instantaneous value that are symmetrical about the current instantaneous value.

11. The method of claim 7 wherein filtering the transmit signal comprises combining respective filter coefficients with respective past instantaneous values of the transmit signal and respective future instantaneous values of the transmit signal and evaluating a maximum value for each instantaneous value of the transmit signal.

12. The method of claim 7 wherein filtering the transmit signal comprises:
applying a finite impulse response filter to the transmit signal, the finite impulse response filter having filter coefficients chosen so that the filter coefficients for past instantaneous values of the transmit signal match filter coefficients for future instantaneous values of the transmit signal.

13. The method of claim 7 further comprising:
applying the filtered transmit signal to a shaping table to produce a shaped signal; and
tracking the envelope of the shaped signal to produce the voltage supply signal.

14. The method of claim 13 further comprising:
applying the shaped signal from the shaping table to a linear filter having a frequency response tailored to compensate for frequency selective effects introduced by generating the voltage supply signal having a voltage magnitude that tracks the envelope of the filtered transmit signal.

15. The method of claim 7 further comprising:
applying a shaping function to the transmit signal to produce a shaped transmit signal; and
filtering the shaped transmit signal in a symmetric peak filter.

16. A communication device comprising:
an antenna;
system logic to control operation of the communication device;
a transmit and receive path comprising:
a baseband controller to produce a transmit signal;
a power amplifier coupled to the baseband controller and the antenna to amplify the transmit signal and apply the amplified signal to the antenna for transmission from the communication device;
an envelope tracking circuit coupled to the envelope circuit, the power amplifier and the baseband controller, the envelope tracking circuit comprising:
an envelope circuit configured to produce an envelope signal representative of an envelope of the transmit signal;
an envelope tracking power supply coupled to the envelope circuit and the power amplifier to provide a dynamically variable power supply signal to the power amplifier by tracking the envelope signal; and
a filter coupled to the baseband controller to produce a filtered signal as the envelope signal by applying a non-linear filter function to the envelope signal using instantaneous current values, instantaneous past values and instantaneous future values with a non-linear dependency on the instantaneous past values and instantaneous future values.

17. The communication device of claim 16 wherein the filter comprises a symmetric filter.

18. The communication device of claim 17 wherein the filter comprises a filter producing a filtered signal which is symmetric about peaks of the envelope signal.

19. The communication device of claim 16 wherein the envelope tracking circuit further comprises a de-troughing module to limit negative excursions of the transmit signal before filtering the envelope signal in the filter.

* * * * *